United States Patent
Bhosle et al.

(10) Patent No.: US 11,501,972 B2
(45) Date of Patent: Nov. 15, 2022

(54) SACRIFICIAL CAPPING LAYER FOR PASSIVATION USING PLASMA-BASED IMPLANT PROCESS

(71) Applicant: Applied Materials, Inc., Santa Clara, CA (US)

(72) Inventors: Vikram M. Bhosle, North Reading, MA (US); Nicholas P. T. Bateman, Reading, MA (US); Timothy J. Miller, Ipswich, MA (US); Jun Seok Lee, Andover, MA (US); Deven Raj Mittal, Middleton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 310 days.

(21) Appl. No.: 16/935,774

(22) Filed: Jul. 22, 2020

(65) Prior Publication Data
US 2022/0028693 A1  Jan. 27, 2022

(51) Int. Cl.
*H01L 21/311* (2006.01)
*H01L 21/265* (2006.01)
(Continued)

(52) U.S. Cl.
CPC ...... *H01L 21/26533* (2013.01); *C23C 14/021* (2013.01); *C23C 14/48* (2013.01); *H01L 21/31116* (2013.01); *H01L 21/02274* (2013.01)

(58) Field of Classification Search
CPC ..... H01J 2237/31701; H01L 21/76834; H01L 21/32155; C23C 14/48
See application file for complete search history.

(56) References Cited

U.S. PATENT DOCUMENTS 4,615,766 A * 10/1986 Jackson ............... H01L 21/314
                                                            438/522
6,214,682 B1   4/2001 Wang
(Continued)

FOREIGN PATENT DOCUMENTS

TW    200818278 A    4/2008
TW    201140686 A    11/2011
TW    201939618 A    10/2019

OTHER PUBLICATIONS

Todorov et al., "Correlation of Screen Oxide Thickness and Iron Levels Introduced during Batch High-Current Implants", 1998 International Conference on Ion Implantation Technology, Kyoto Japan, pp. 646-649.

(Continued)

*Primary Examiner* — Jaehwan Oh
(74) *Attorney, Agent, or Firm* — Nields, Lemack & Frame, LLC

(57) ABSTRACT

An apparatus and method of processing a workpiece is disclosed, where a sacrificial capping layer is created on a top surface of a workpiece. That workpiece is then exposed to an ion implantation process, where select species are used to passivate the workpiece. While the implant process is ongoing, radicals and excited species etch the sacrificial capping layer. This reduces the amount of etching that the workpiece experiences. In certain embodiments, the thickness of the sacrificial capping layer is selected based on the total time used for the implant process and the etch rate. The total time used for the implant process may be a function of desired dose, bias voltage, plasma power and other parameters. In some embodiments, the sacrificial capping layer is applied prior to the implant process. In other embodiments, material is added to the sacrificial capping layer during the implant process.

24 Claims, 8 Drawing Sheets

(51) Int. Cl.
  *C23C 14/02*    (2006.01)
  *C23C 14/48*    (2006.01)
  *H01L 21/02*    (2006.01)

(56) References Cited

U.S. PATENT DOCUMENTS

| | | |
|---|---|---|
| 2004/0171201 A1 | 9/2004 | Gambino et al. |
| 2007/0123012 A1* | 5/2007 | Walther .............. H01L 21/3003 438/510 |
| 2008/0076268 A1 | 3/2008 | Kraus et al. |
| 2008/0164539 A1 | 7/2008 | Collaert et al. |
| 2009/0200493 A1* | 8/2009 | Berry, III .......... H01J 37/32431 250/492.21 |
| 2011/0053351 A1 | 3/2011 | Tsai et al. |
| 2011/0139175 A1 | 6/2011 | Cheung et al. |
| 2012/0329269 A1 | 12/2012 | Arnold et al. |
| 2015/0093862 A1 | 4/2015 | Nainani et al. |
| 2015/0115446 A1* | 4/2015 | Kittl ........................ H01L 29/45 438/642 |
| 2015/0200109 A1 | 7/2015 | Kong et al. |
| 2019/0019690 A1 | 1/2019 | Choi et al. |

OTHER PUBLICATIONS

Veprek et al., "Role of Oxygen Impurities in Etching of Silicon by Atomic Hydrogen", Journal of Vacuum Science & Technology A, vol. 26, pp. 313-320, May 2008.
International Search Report and Written Opinion dated Oct. 28, 2021 in corresponding PCT application No. PCT/US2021/038836.

* cited by examiner though the sacrificial capping layer and into the portion by applying a bias voltage to the workpiece, and wherein during the implant process, the radicals and excited molecules etch the sacrificial capping layer; and terminating the implant process when a desired dose of passivating species has been implanted, wherein at termination of the implant process, a thickness of the sacrificial capping layer is less than 5 angstroms or all of the sacrificial capping layer has been completely removed and less than 10 angstroms of the workpiece has been etched. In certain embodiments, the sacrificial capping layer is applied in the plasma chamber during a capping period by introducing a capping species, and creating a plasma comprising the capping species while the bias voltage is disabled. In some embodiments, the capping period is prior to the implant process. In some embodiments, additional sacrificial capping layer is applied during the implant process by flowing the capping species into the plasma chamber. In some further embodiments, the flow of the capping species is continuous throughout the implant process. In some further embodiments, the flow of the capping species is pulsed during the implant process. In some further embodiments, the bias voltage is varied when the capping species is flowing into the plasma chamber during the implant process. In certain embodiments, the implant process is terminated after a predetermined time, where the predetermined time is determined based on the passivating species and the desired dose of passivating species. In some embodiments, a warning is generated if an output of a metrology system indicates that the workpiece is being etched. In certain embodiments, the implant process is terminated based on an output from a metrology system indicating that the workpiece is being etched. In certain embodiments, an initial thickness of the sacrificial capping layer is determined based on an etch rate of the sacrificial capping layer and a total duration of the implant process. In some further embodiments, the initial thickness is adjusted based on chamber metrology, number of workpieces processed, or hours of operation to compensate for varying etch rate. In certain embodiments, the thickness of the sacrificial capping layer is between 5 angstroms and 100 angstroms. In certain embodiments, when the bias voltage is applied, the bias voltage is a pulsed DC voltage between 0.1 and 10 kV.

SACRIFICIAL CAPPING LAYER FOR PASSIVATION USING PLASMA-BASED IMPLANT PROCESS

FIELD

Embodiments of the present disclosure relate to systems and methods for passivating a workpiece using a plasma chamber, and more particularly, to passivating the workpiece using implantation while minimizing the etching of the workpiece.

BACKGROUND

Semiconductor workpieces are often implanted with dopant species to create a desired conductivity. Plasma implantation is an effective method of doping or otherwise modifying surfaces of a semiconductor device to form devices, such as transistors.

As geometries continue to get smaller, new issues arise that affect the performance and reliability of these smaller transistors. For example, for advanced transistors, gate reliability, specifically negative bias temperature instability (NBTI) is one of the critical parameters for device performance and reliability. The issue of gate oxide reliability is even more critical as the industry migrates to more advanced channel materials such as high germanium concentrated SiGe films.

Gate oxide reliability is mainly related to the defects and trap states at the gate oxide interface and the performance can be enhanced by passivating these defects. For example, these defects can be passivated using species such as hydrogen, deuterium and fluorine.

These species can be introduced using a number of different processes. In certain embodiments, ion implantation is used to introduce these species. There are several advantages of this approach, as high doping levels can be achieved at a high dose rate, thus enabling cost of ownership advantages, at especially low implant energies.

However, implantation of a workpiece using a plasma-based process can be challenging, due to the presence of radicals and excited species along with the ions during the implant process. The radicals and excited species can lead to excessive etching of the surface layers and thus adversely affecting the device performance.

Therefore, an apparatus and method that enables the implantation of species to passivate a workpiece without etching the surface of that workpiece would be beneficial. Further, it would be beneficial if this method did not add significant time or cost to the overall semiconductor fabrication process.

SUMMARY

An apparatus and method of processing a workpiece is disclosed, where a sacrificial capping layer is created on a top surface of a workpiece. That workpiece is then exposed to an ion implantation process, where select species are used to passivate the workpiece. While the implant process is ongoing, radicals and excited species etch the sacrificial capping layer. This reduces the amount of etching that the workpiece experiences. In certain embodiments, the thickness of the sacrificial capping layer is selected based on the total time used for the implant process and the etch rate. The total time used for the implant process may be a function of desired dose, bias voltage, plasma power and other parameters. In some embodiments, the sacrificial capping layer is applied prior to the implant process. In other embodiments, material is added to the sacrificial capping layer during the implant process.

According to one embodiment, a method of passivating a portion of a workpiece is disclosed. The method comprises disposing the workpiece in a plasma chamber; applying a sacrificial capping layer to a top surface of the workpiece; creating a plasma comprising a passivating species within the plasma chamber, wherein the passivating species is selected from the group consisting of hydrogen, deuterium, fluorine and gas mixtures containing hydrogen, deuterium or fluorine as a diluent or primary processing gas and wherein ions, radicals and excited molecules of the passivating species are generated; performing an implant process wherein the ions of the passivation species are implanted According to another embodiment, a method of passivating a portion of a workpiece is disclosed. The method comprises applying a sacrificial capping layer to a top surface of the workpiece in a chamber, wherein a thickness of the sacrificial capping layer is between 5 angstroms and 100 angstroms; disposing the workpiece in a plasma chamber, wherein the plasma chamber is different from the chamber; creating a plasma comprising a passivating species within the plasma chamber, wherein the passivating species is selected from the group consisting of hydrogen, deuterium, fluorine and gas mixtures containing hydrogen, deuterium or fluorine as a diluent or primary processing gas and wherein ions, radicals and excited molecules of the passivating species are generated; performing an implant process wherein the ions of the passivation species are implanted through the sacrificial capping layer and into the portion by applying a bias voltage to the workpiece, and wherein during the implant process, the radicals and excited molecules etch the sacrificial capping layer; and terminating the implant process when a desired dose of passivating species has been implanted. In certain embodiments, the chamber heats the workpiece to a temperature near the temperature of the implant process; and grows the sacrificial capping layer by flowing a gas while the workpiece is being heated.

According to another embodiment, a method passivating a portion of a workpiece is disclosed. The method comprises flowing a capping species into the plasma chamber, within which a workpiece is disposed; energizing the capping species to generate a plasma, wherein, during a capping period, a bias voltage is not applied to the workpiece, so as to create a sacrificial capping layer on a top surface of the workpiece; flowing a passivating species into the plasma chamber wherein the passivating species is selected from the group consisting of hydrogen, deuterium, fluorine and gas mixtures containing hydrogen, deuterium or fluorine as a diluent or primary processing gas; performing an implant process, to implant passivating ions into the workpiece, wherein the implant process is defined as a period of time when a bias voltage is applied to the workpiece while a plasma comprising the passivating species is being generated; adding material to sacrificial capping layer by flowing the capping species into the plasma chamber during the implant process; and terminating the implant process. In certain embodiments, the implant process is terminated when a desired dose of passivating ions has been implanted. In certain embodiments, at termination of the implant process, a thickness of the sacrificial capping layer is less than 5 angstroms or all of the sacrificial capping layer has been completely removed and less than 10 angstroms of the workpiece has been etched. In certain embodiments, the flow of the capping species is continuous throughout the implant process. In certain embodiments, the flow of the capping species is pulsed during the implant process. In some further embodiments, the bias voltage is varied when the capping species is flowing into the plasma chamber during the implant process. In certain embodiments, wherein the amount of material added is varied based on chamber metrology, number of workpieces processed, or hours of operation to compensate for varying etch rate. In some further embodiments, the capping species flows through a mass flow controller to the plasma chamber and the amount of material is carried by adjusting a flow rate of the capping species, the frequency at which the mass flow controller is actuated, or the duty cycle of the mass flow controller.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
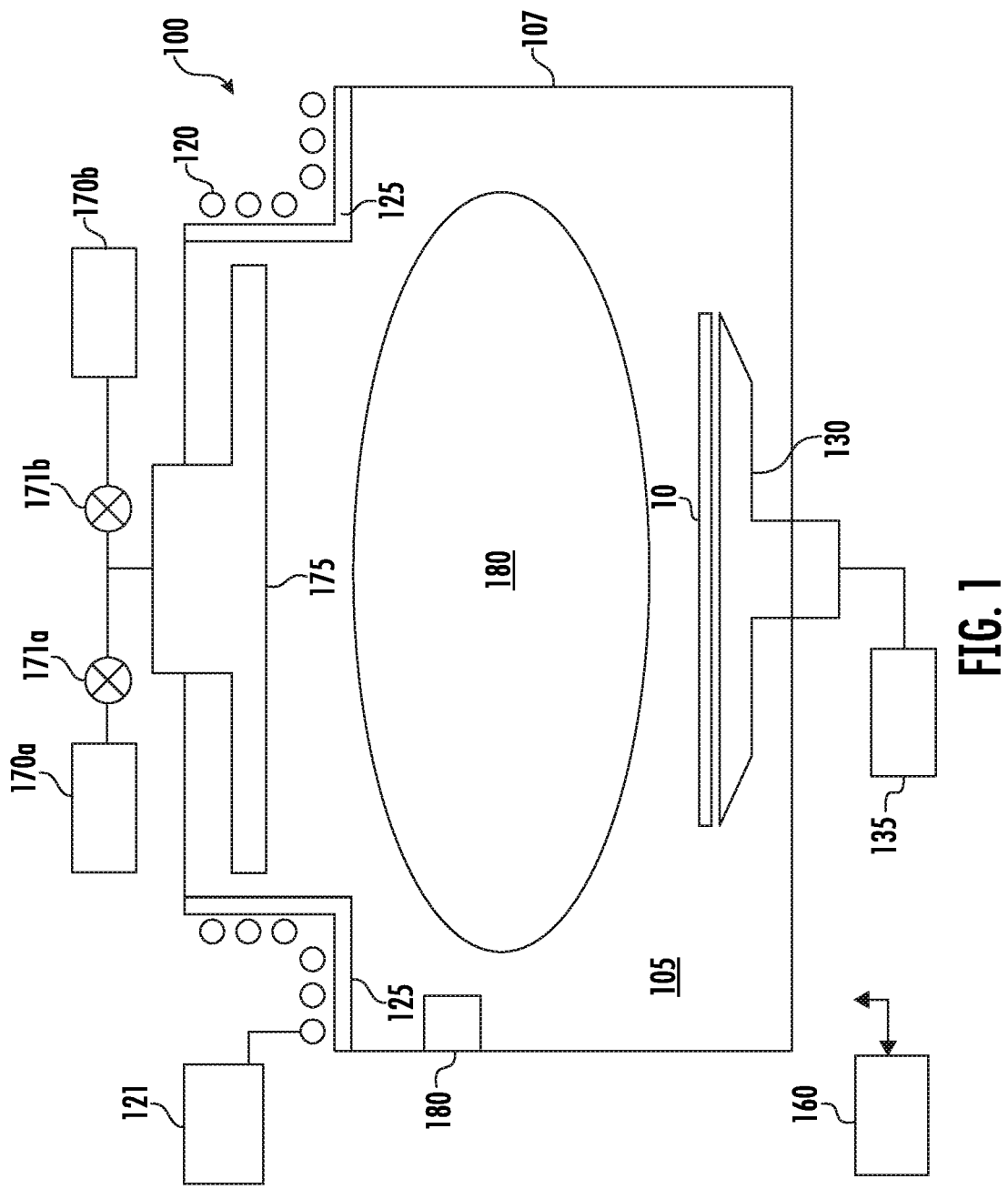
FIG. 1 shows the ion source according to one embodiment.

FIG. 1 shows a cross-section of an embodiment of a plasma chamber 105 of an ion source 100 that may be used with the present disclosure. The ion source 100 includes a plasma chamber 105 defined by several plasma chamber walls 107, which may be constructed from aluminum, graphite or another suitable material. This plasma chamber 105 may be supplied with one or more feedgasses, stored in one or more feedgas containers 170a, 170b that enters the plasma chamber 105 via a gas baffle 175. Mass flow controllers 171a, 171b may be used to regulate the flow of the feedgas from the feedgas containers 170a, 170b, respectively, into the plasma chamber 105. This feedgas may be energized by an RF antenna 120 or another plasma generation mechanism. The RF antenna 120 is in electrical communication with a RF power supply 121 which supplies power to the RF antenna 120. A dielectric window 125, such as a quartz or alumina window, may be disposed between the RF antenna 120 and the interior of the plasma chamber 105.

A workpiece 10 is disposed within the plasma chamber 105, on a platen 130. The platen 130 is in electrical communication with a bias power supply 135, which is used to negatively bias the platen 130 during certain time periods so that positive ions are attracted toward the workpiece 10.

Further, the platen 130 may also be heated. In one embodiment, a heated fluid may flow through channels embedded in the platen 130. In another embodiment, heating elements, such as resistive elements, may be embedded in the platen to heat it.

A controller 160 may be in communication with the bias power supply 135, the RF power supply 121 and the mass flow controllers 171a,171b that control the flow of feedgasses into the plasma chamber 105. The controller 160 may include a processing unit, such as a microcontroller, a personal computer, a special purpose controller, or another suitable processing unit. The controller 160 may also include a non-transitory computer readable storage element, such as a semiconductor memory, a magnetic memory, or another suitable memory. This non-transitory storage element may contain instructions and other data that allows the controller 160 to perform the functions described herein.

As explained above, when using a plasma chamber, such as that shown in FIG. 1, it is possible that the surface of the workpiece is etched by radicals and/or excited species when implanting ions into a workpiece 10. This has the effect of removing material from the surface of the workpiece 10, which may result in decreased performance. When feedgasses are introduced into the plasma chamber and the RF antenna 120 is energized, some of the feedgas is ionized into a plasma. These ions are subject to electrical fields and thus can be controlled and manipulated. However, some molecules of the feedgas are excited but not ionized. Other molecules are broken into radicals.

Both excited molecules and radicals are highly reactive, and tend to react with any surface. Thus, if radicals contact a surface of the workpiece 10, the radicals react with the material of the workpiece 10, typically silicon, and material is removed. Thus, while ions are beneficially being implanted into the workpiece 10 to passivate the workpiece 10, radicals and excited molecules are detrimentally etching the surface of the workpiece.

Figure 2:
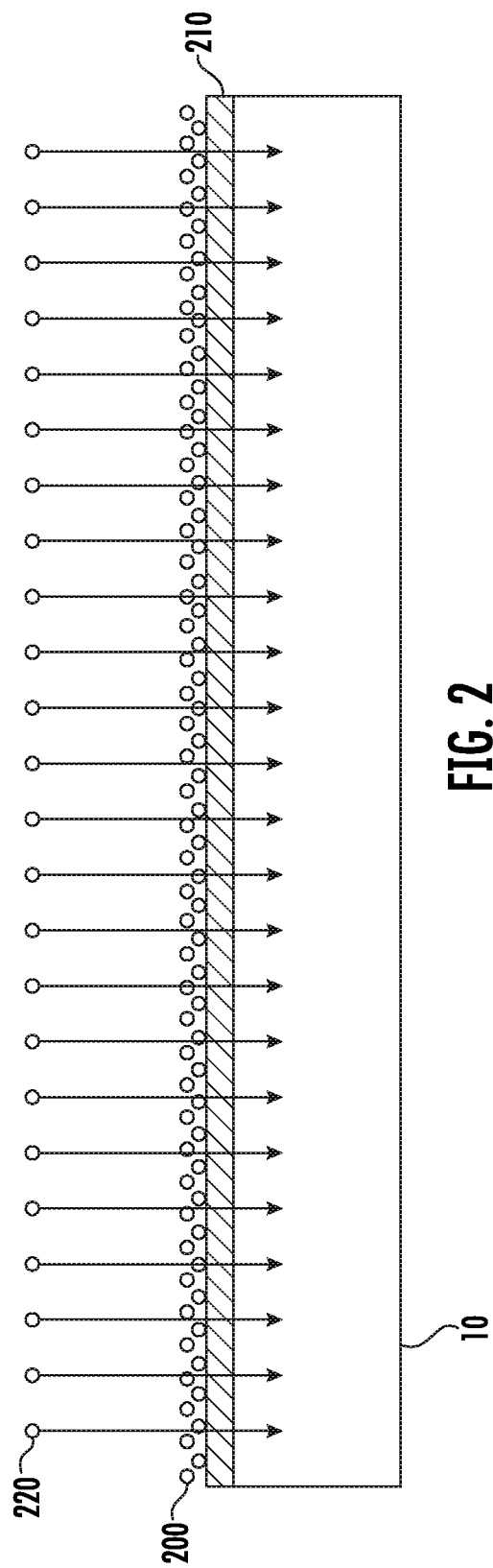
FIG. 2 shows the interaction between the sacrificial capping layer, the ions and the radicals.

To retain the benefit of implanting passivation ions while resisting the etching effect of the radicals and excited molecules, a sacrificial capping layer may be provided on top of the workpiece, as shown in FIG. 2. As can be seen, radicals and excited molecules 200 may react with the sacrificial capping layer 210 disposed on top of the workpiece 10. At the same time, passivating ions 220 pass through the sacrificial capping layer 210 and are implanted into the workpiece 10.

The sacrificial capping layer 210 comprises a material that resists the etching effects of the radicals and excited molecules 200. In other words, the etch rate of the sacrificial capping layer 210 is less than the etch rate of the underlying workpiece 10. In some embodiments, the etch rate of the sacrificial capping layer 210 may be 5 to 10 times slower than the etch rate of the underlying workpiece. In certain embodiments, the etch rate of the sacrificial capping layer 210 may be more than 10 times slower than the etch rate of the underlying workpiece. In certain embodiments, the sacrificial capping layer may be silicon dioxide (SiO2), silicon nitride ($Si_xN_y$), or silicon oxynitride ($Si_xO_yN_z$).

The sacrificial capping layer 210 may be between 5 and 100 angstroms in thickness. In other embodiments, the sacrificial capping layer 210 may be between 10 angstroms and 100 angstroms. In other embodiments, the sacrificial capping layer 210 may be between 20 angstroms and 100 angstroms. This thickness is selected such that the passivating ions 220 may still pass through the sacrificial capping layer 210. Further, the thickness is selected such that the sacrificial capping layer 210 may be completely or nearly completely etched by the radicals and excited molecules 200 during the implanting of the passivating ions 220. Thus, the thickness of the sacrificial capping layer 210 may be determined based on the implant time as well as the etch rate of the sacrificial capping layer 210.

This sacrificial capping layer 210 may be applied in a number of different ways. For example, the sacrificial capping layer 210 may be applied either within the plasma chamber that is used to perform the ion implant or in a separate chamber.

When the sacrificial capping layer is grown in the same plasma chamber used to perform the passivating ion implantation, there are several different sequences that can be employed.

Figure 3A:
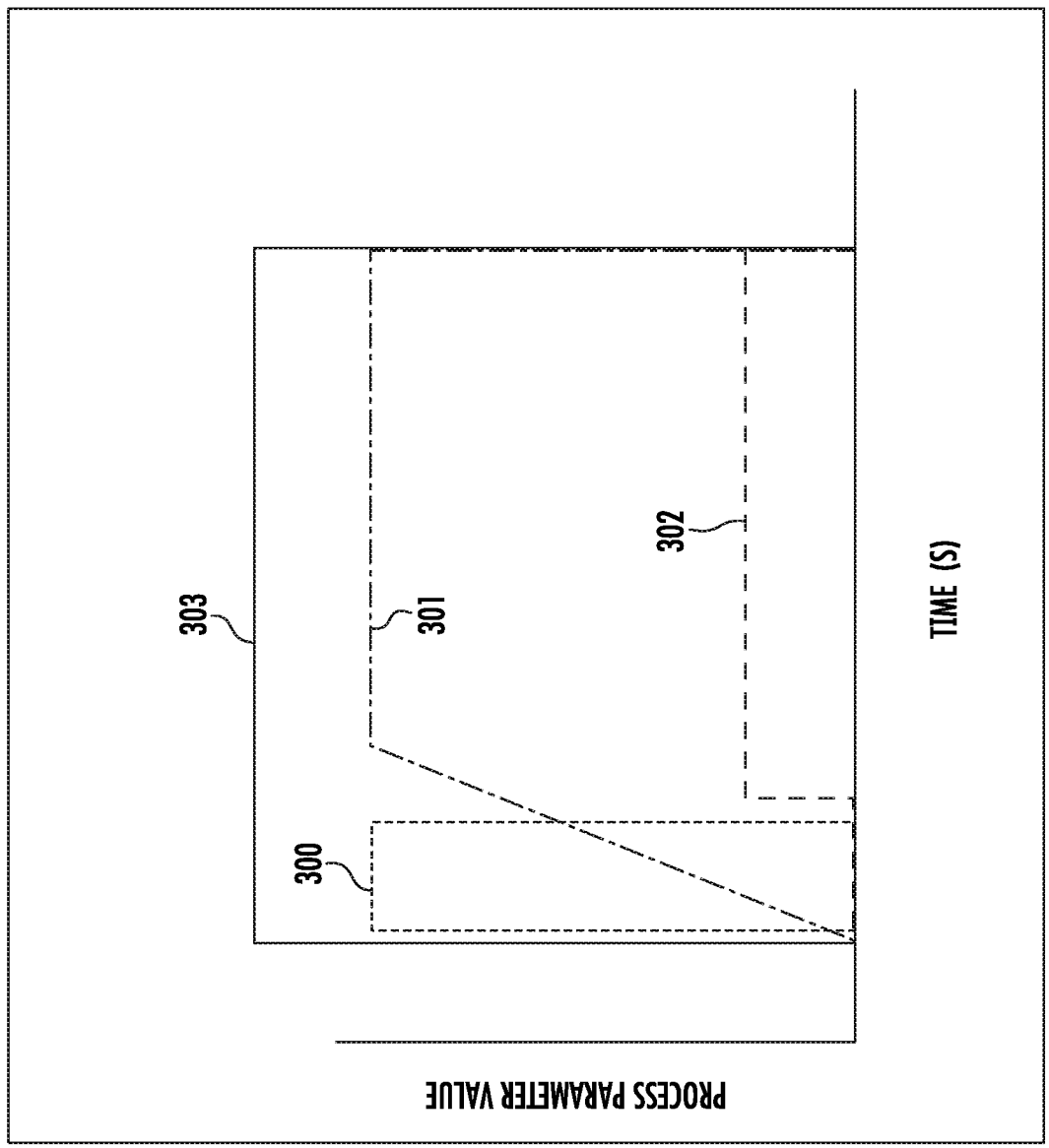
FIGS. 3A-3C show timing diagrams for the capping period and implant process according to different embodiments.

FIG. 3A shows a first embodiment. In this figure, the vertical axis is used to represent the process parameter value. Line 300 represents the flow rate of the capping species. The capping species includes any species that may be used to grow a sacrificial capping layer, including oxygen ($O_2$) and nitrogen ($N_2$). Other species may also be used to grow the sacrificial capping layer, such as nitric oxide (NO) or nitrogen dioxide ($NO_2$). All of these species may be referred to as capping species, as these species are used for the growth of the sacrificial capping layer. Line 301 represents the flow rate of the passivating species. Line 302 represents the bias voltage applied by the bias power supply 135 (see FIG. 1). Actuation of the RF power supply 121 is shown in line 303.

Figure 3B:
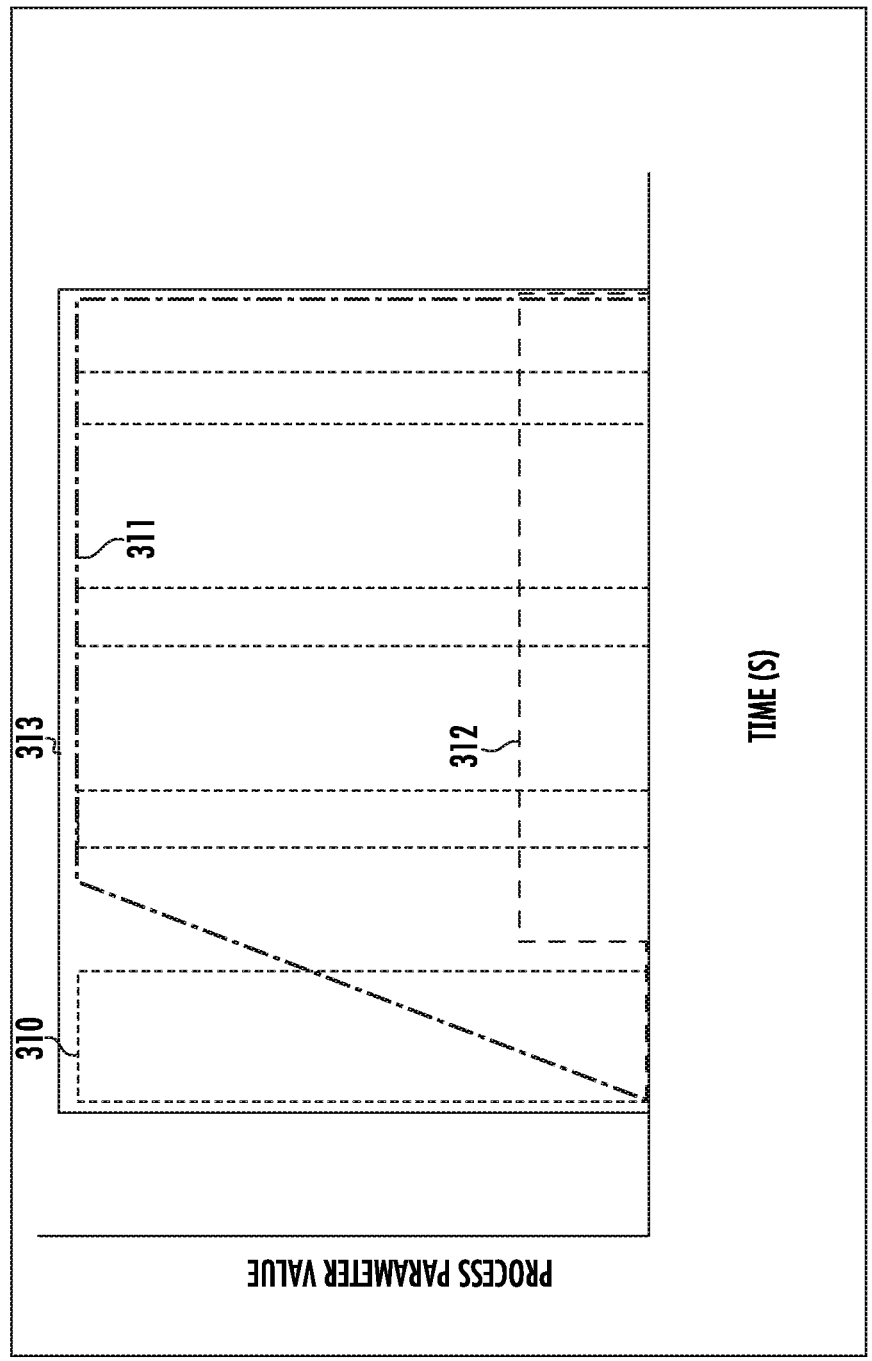
Figure 3C:
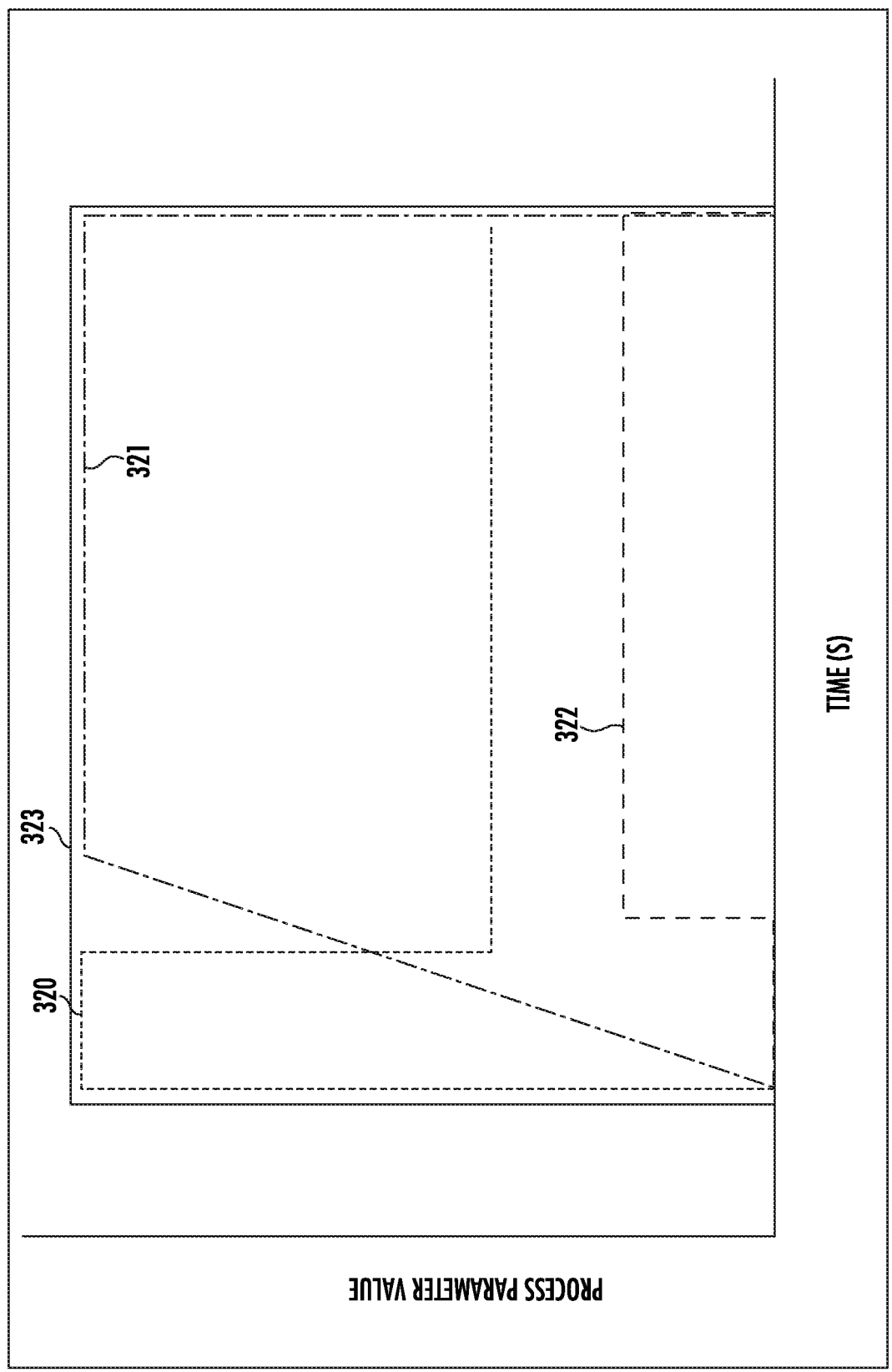

In this embodiment, the RF power supply 121 is actuated approximately at the same time as the introduction of the capping species. The capping species may be stored in feedgas container 170a. Thus, to introduce the capping species, the controller 160 may actuate the mass flow controller 171a to allow a desired flow rate of the capping species into the plasma chamber 105. The actuation of the RF power supply 121 ionizes the capping species, which allows the sacrificial capping layer 210 to be grown on the top surface of the workpiece. The bias voltage is not enabled at this time so that the ionized capping species are not implanted into the workpiece. The period of time when the RF power supply 121 is actuated, the mass flow controller 171a is actuated and the bias voltage is not enabled may be referred to as the capping period. As the sacrificial capping layer is being grown during the capping period, the flow of the passivating species may begin, as shown in line 301. The passivating species may be hydrogen, deuterium, fluorine or gas mixtures containing hydrogen, deuterium or fluorine as a diluent or primary processing gas. The passivating species may be stored in feedgas container 170b and the controller 160 may actuate mass flow controller 171b to allow the flow of the passivating species into the plasma chamber 105. Of course, the rate at which the passivating species is introduced may differ from that shown in FIG. 3A. After the flow of the capping species has been stopped, such as by disabling the mass flow controller 171a, a bias voltage may be applied by the bias power supply 135 as shown in line 302. While FIGS. 3A-3C shows the bias voltage as appearing positive, it is understood that a negative bias voltage is used to attract positive ions. The bias voltage may be a pulsed DC voltage, having an amplitude of between 0.1 kV and 10 kV, depending on the passivating species. For example, heavier passivating species, such as fluorine, may utilize a greater bias voltage than a lighter passivating species, such as hydrogen. The amplitude of the bias voltage is selected to allow the passivating ions to pass through the sacrificial capping layer and stop in the portion of the workpiece 10 that is to be passivated.

In certain embodiments, this portion may be an interface between a poly-silicon and another material, such as in the gate of a transistor. Examples of two different semiconductor structures that utilize the sacrificial capping layer during the passivation process are found in FIGS. 5A-5B. In FIG. 5A, a transistor is shown having a source 500 and a drain 510 created in a silicon substrate. A gate 520 is then formed on the silicon substrate between the source 500 and the drain 510. The gate 520 may include a gate oxide 521 and a polycrystalline silicon (poly-silicon) layer 522 disposed on the gate oxide 521. Atop the poly-silicon layers is a sacrificial capping layer 210.

Figure 5B:
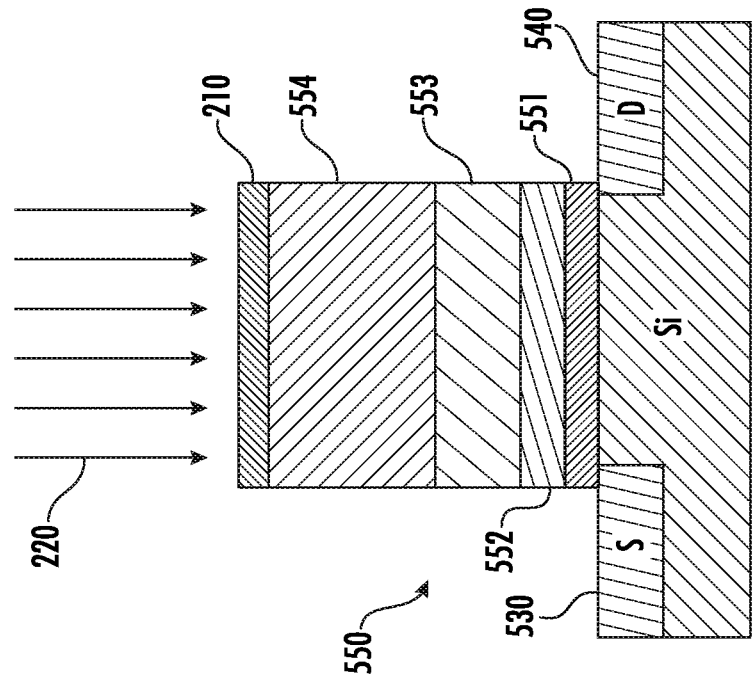
FIG. 5A-5B show two representative transistors that may utilize the sacrificial capping layer.
Figure 5A:
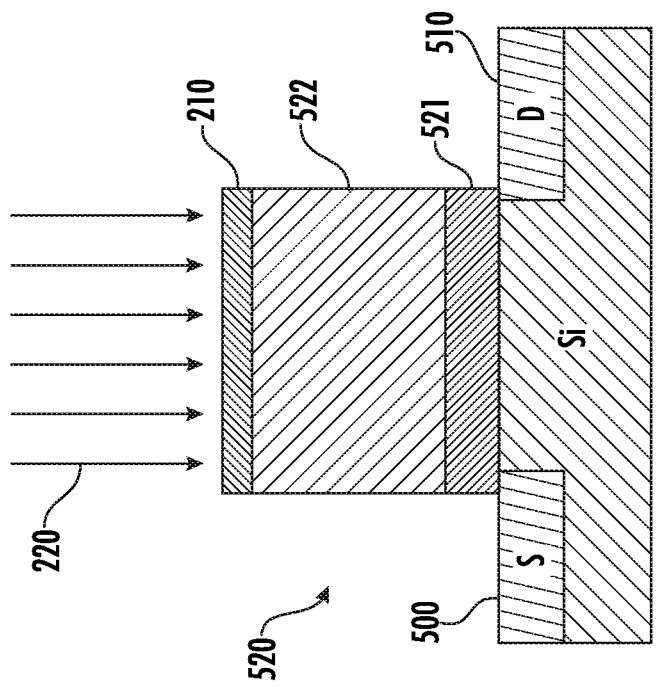

In FIG. 5B, a transistor having a metal gate is shown. The transistor has a source 530 and a drain 540 created in a silicon substrate. A gate 550 is then formed on the silicon substrate between the source 530 and the drain 540. The gate 550 comprises an interfacial layer 551, a high K layer 552, a metal gate 553 and a poly-silicon layer 554. Atop the poly-silicon layer is a sacrificial capping layer 210.

The RF power supply 121 may remain actuated while the passivating species is being flowed into the plasma chamber 105. When the bias power supply 135, the RF power supply 121 and the mass flow controller 171b are all actuated, implantation of the workpiece occurs. Thus, this period of time may be referred to as the implant process. The implant process continues until the desired dose is implanted in the workpiece. The desired dose may be between 1E15 and $3E17/cm^3$.

During the implant process, radicals and excited molecules 200 etch the sacrificial capping layer 210. The thickness of the sacrificial capping layer 210 may be such that the sacrificial capping layer 210 is completely or mostly etched away during the implant process. For example, in one embodiment, when the implant process ends, the dose within the implanted portion of the workpiece 10 may be within the desired range and no more than 5 angstroms of the sacrificial capping layer 210 remain. In another embodiment, when the implant process ends, the dose within the implanted portions of the workpiece 10 may be within the desired range, the sacrificial capping layer 210 is completely etched and no more than 10 angstroms of the workpiece 10 have been etched.

Thus, the thickness of the sacrificial capping layer 210, which is applied during the capping period prior to the implant process, is determined by the implant time and the etch rate of the sacrificial capping layer 210. The etch rate of the sacrificial capping layer 210 may be determined based on the material used to create the sacrificial capping layer 210, the passivating species, and other process parameters. The implant time may be determined by the power supplied by the RF power supply 121, the bias voltage and the desired dose.

In other words, in one embodiment, the implant time is calculated based on the parameters described above. Once this is determined, the initial thickness of the sacrificial capping layer 210 can be determined based on this implant time and the etch rate. Note that in certain embodiments, the etch rate of the sacrificial capping layer 210 may change as a function of hours of operation since the last cleaning. For example, the etch rate may change as the walls of the plasma chamber become coated with materials created during earlier processes. Thus, in certain embodiments, the controller 160 may monitor hours of operation since the last cleaning and adjust the etch rate based on this monitored value. In certain embodiments, the controller 160 may monitor the number of workpieces that have been processed since the last cleaning and adjust the etch rate based on this monitored value. In another embodiment, the controller 160 may rely on a metrology system to determine the actual etch rate of the sacrificial capping layer. Thus, in these embodiments, the controller monitors a parameter, such as hours of operation, number of workpieces processed, or an output from a metrology system to compensate for a varying etch rate that occurs over time.

Thus, the controller 160 may perform the following sequence. First, as shown in Box 400 of FIG. 4, the passivating species and the desired dose of the passivating species may be determined or provided to the controller 160. Based on this information, the controller 160 may determine an implant time that may be used to deliver the desired dose, as shown in Box 410. The controller 160 may then determine or be provided with the selected capping species, as shown in Box 420. Next, the controller optionally determines the amount of time that the plasma chamber 105 has been operating since the last cleaning, as shown in Box 430. Alternatively, the controller 160 may determine the number of workpieces that have been processed since the last cleaning. The controller 160 then determines the estimated etch rate of the sacrificial capping layer 210, based on the passivating species, the capping species, the power applied by the RF power supply, and optionally the number of hours of operation of the plasma chamber or number of workpieces processes, as shown in Box 440. In another embodiment, the controller 160 may utilize metrology to determine the change in etch rate as a result of chamber usage. Based on the etch rate and the implant time, the controller 160 calculates the desired initial thickness of the sacrificial capping layer 210, as shown in Box 450. The initial thickness may be calculated as a product of the etch rate and the total implant time. Using this information, the controller 160 can calculate the duration of the capping period, where the mass flow controller 171*a* is actuated to form the sacrificial capping layer, as shown in Box 460. In other words, the initial thickness of the sacrificial capping layer 210 is calculated as a function of the subsequent implant time, which, in turn, is a function of the passivating species and the desired dose.

If desired, the sequence shown in FIG. 3A may be repeated a plurality of times. FIG. 3A shows a sequence where the sacrificial capping layer 210 is created and then the implant process is performed until the sacrificial capping layer 210 is etched away.

Figure 4:
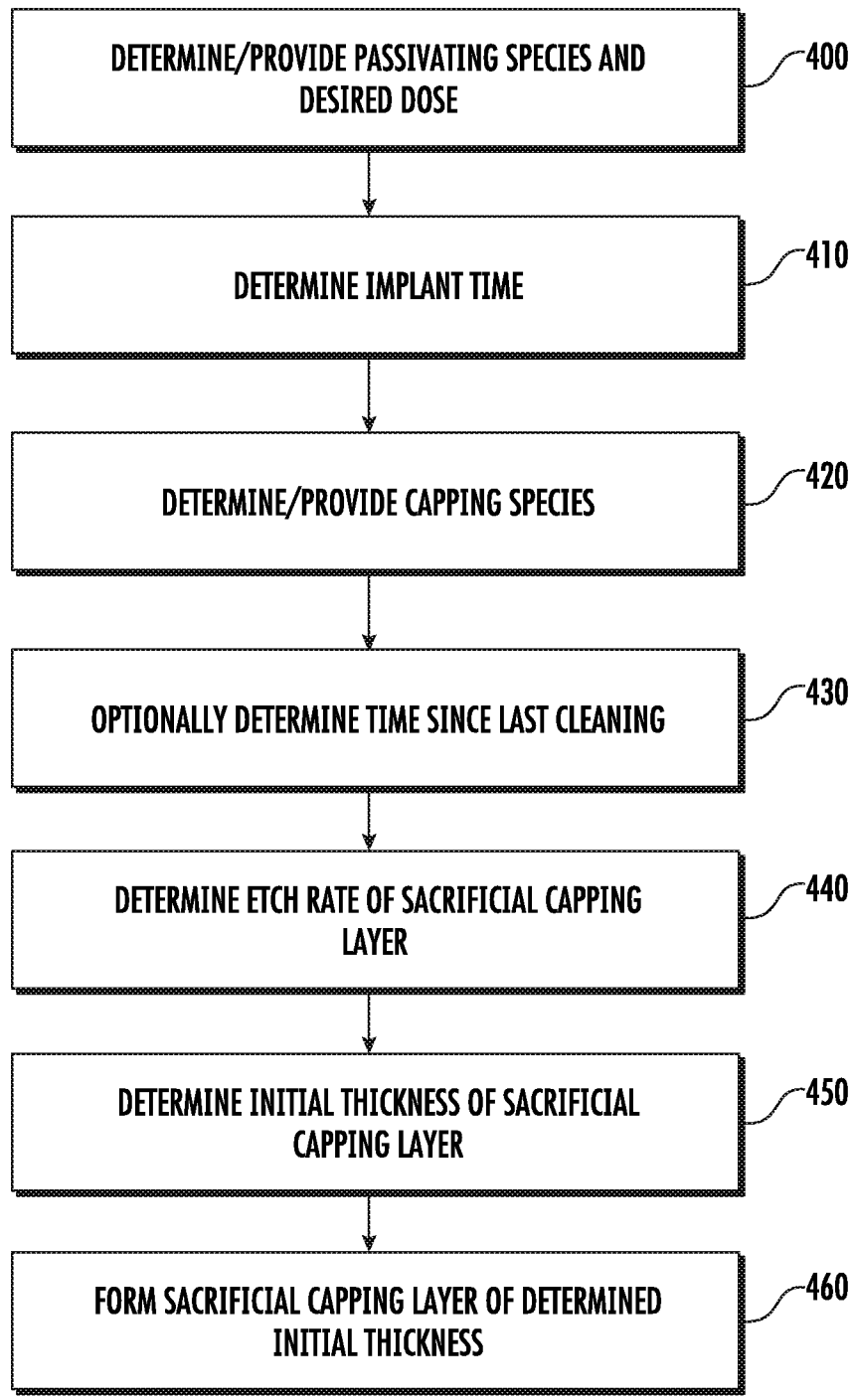
FIG. 4 shows a flowchart that may be used to determine the initial thickness of the sacrificial capping layer.

Thus, in certain embodiments, a thinner sacrificial capping layer may be grown, and a shorter implant process may be performed. After the thin sacrificial capping layer has been etched away, the sequence shown in FIG. 3A may be repeated. Thus, the sequence of a capping period followed by an implant process may be repeated a plurality of times. While this may add time to the total fabrication process, it may allow a thinner initial sacrificial capping layer than would be used if the sequence of FIG. 4 is only executed once. This may allow the passivating ions 220 to travel to a greater depth, especially at the start of the implant process.

FIG. 3B shows another embodiment. In this figure, the vertical axis is used to represent the process parameter value. Line 310 represents the flow rate of the capping species. The capping species includes any species that may be used to grow a sacrificial capping layer, including oxygen ($O_2$) and nitrogen ($N_2$). Other species may also be used to grow the sacrificial capping layer, such as nitric oxide (NO) or nitrogen dioxide ($NO_2$). All of these species may be referred to as capping species, as these species are used for the growth of the sacrificial capping layer. Line 311 represents the flow rate of the passivating species. Line 312 represents the bias voltage applied by the bias power supply 135 (see FIG. 1). As stated above, the bias voltage appears positive, however, it is understood that a negative bias voltage is used to attract positive ions. Actuation of the RF power supply 121 is shown in line 313.

In this embodiment, the mass flow controller 171*a* is actuated to allow the flow of the capping species. As described above, during the capping period, the bias voltage is disabled at this time so that the ions of the capping species are not implanted. After a predetermined amount of time, the flow of the passivating species may begin, as shown in line 311. The passivating species may be hydrogen, deuterium, fluorine or gas mixtures containing hydrogen, deuterium or fluorine as a diluent or primary processing gas. The passivating species may be stored in feedgas container 170*b* and the controller 160 may actuate mass flow controller 171*b* to allow the flow of the passivating species into the plasma chamber 105. Of course, the rate at which the passivating species is introduced may differ from that shown in FIG. 3B. After the flow of the capping species has been stopped, such as by disabling the mass flow controller 171*a*, a bias voltage may be applied by the bias power supply 135 as shown in line 312. The bias voltage may be a pulsed DC voltage, having an amplitude of between 0.1 kV and 10 kV, depending on the passivating species. The amplitude of the bias voltage is selected to allow passivating ions 220 to pass through the sacrificial capping layer 210 and stop in the portion of the workpiece that is to be passivated. In certain embodiments, this portion may be an interface between a poly-silicon and another material, such as was shown in FIGS. 5A-5B. The RF power supply 121 may remain actuated while the passivating species is being flowed into the plasma chamber 105. When the bias power supply 135, the RF power supply 121 and the mass flow controller 171*b* are all actuated, the implant process occurs. The implant process continues until the desired dose is implanted in the workpiece 10. The desired dose may be between 1E15 and $3E17/cm^3$. However, unlike the embodiment shown in FIG. 3A, periodically, the controller 160 actuates the mass flow controller 171a so as to allow the flow of capping species during the implant process. In certain embodiments, the capping species is much heavier than the passivating species. For example, the capping species may be oxygen or nitrogen, while the passivating species is hydrogen or deuterium. Consequently, even if ions of the capping species are implanted, they will travel to a much shallower depth than the passivating ions 220. Further, the presence of the sacrificial capping layer 210 may further slow these ions of the capping species. In certain embodiments, (although not shown) the bias voltage may be reduced during the times when the capping species is flowing into the plasma chamber 105 during the implant process. This may also serve to reduce the number of ions of the capping species that are implanted and the depth at which these ions are implanted.

In this embodiment, the sacrificial capping layer 210 may be being etched by the radicals and excited molecules 200 of the passivating species during the implant process, but the sacrificial capping layer 210 is also being grown during the implant process. This effectively lowers the etch rate of the sacrificial capping layer 210. This allows a thinner initial sacrificial capping layer to be grown before the implant process, as compared to the embodiment of FIG. 3A. This may allow the passivating ions to travel to a greater depth, especially at the start of the implant process.

Thus, FIG. 3B shows a sequence where a sacrificial capping layer 210 is created during the capping period, and then an implant process is performed, wherein periodically during the implant process, the sacrificial capping layer is grown by actuating the mass flow controller 171a. Note that FIG. 3B shows line 310 acting as a periodic function during the implant process in that it has a constant amplitude, frequency and duty cycle. However, other embodiments are also possible. For example, the duty cycle at which the mass flow controller 171a is actuated may decrease or increase as the implant process proceeds. Additionally, the frequency at which the mass flow controller 171a is actuated may decrease or increase as the implant process proceeds.

Further, in FIG. 3B, the flow rate of the capping species is shown to be constant whenever the mass flow controller 171a is actuated. However, in certain embodiments, the flow rate of the capping species may be lower during the implant process than the flow rate during the capping period.

In this embodiment, the controller calculates an initial thickness of the sacrificial capping layer 210. However, unlike the previous embodiment, the controller 160 also considers that material will be added to the sacrificial capping layer during the implant process. The amount of material added to the sacrificial capping layer is a function of the flow rate of the mass flow controller 171a during the implant process, as well as the duty cycle and frequency of the mass flow controller 171a. The etch rate may be calculated as described above. Additionally, the total amount of sacrificial capping layer that is etched can be determined as described above. Further, the controller 160 may use information, such as hours of operation since last cleaning, number of workpieces processed since last cleaning, or the output of a metrology system to determine a change in etch rate over time. Based on this modified etch rate, the controller 160 may vary the flow rate of the mass flow controller 171a, or alter the frequency or duty cycle of the mass flow controller 171a to compensate for the varying etch rate.

Therefore, in this embodiment, the initial thickness of the sacrificial capping layer 210 can be calculated as the product of the etch rate of the sacrificial capping layer and the total implant time, minus the amount of material that is added to the sacrificial capping layer during the implant process. Thus, the initial thickness of the sacrificial capping layer is thinner in the embodiment shown in FIG. 3B than in the embodiment shown in FIG. 3A. This may allow the passivating ions to travel to a greater depth, especially at the start of the implant process.

FIG. 3C shows a third embodiment, which is similar to FIG. 3B. In this figure, the vertical axis is used to represent the process parameter value. Line 320 represents the flow rate of the capping species. The capping species includes any species that may be used to grown a sacrificial capping layer, including oxygen ($O_2$) and nitrogen ($N_2$). Other species may also be used to grow the sacrificial capping layer, such as nitric oxide (NO) or nitrogen dioxide ($NO_2$). All of these species may be referred to as capping species, as these species are used for the growth of the sacrificial capping layer. Line 321 represents the flow rate of the passivating species. Line 322 represents the bias voltage applied by the bias power supply 135 (see FIG. 1). Again, the bias voltage appears positive, however, it is understood that a negative bias voltage is used to attract positive ions. Actuation of the RF power supply 121 is shown in line 323.

In this embodiment, rather than pulsing the mass flow controller 171a during the implant process, the flow of the capping species is always enabled during the implant process. In certain embodiments, such as that shown in FIG. 3C, the flow rate of the capping species may be constant throughout the implant process. However, in other embodiments, the flow rate may increase or decrease throughout the implant process. Additionally, the flow rate of the capping species during the implant process may be less than the flow rate during the capping period.

Further, the controller 160 may use information, such as hours of operation since last cleaning, number of workpieces processed since last cleaning, or the output of a metrology system to determine a change in etch rate over time. Based on this modified etch rate, the controller 160 may vary the flow rate of the mass flow controller 171a, or alter the frequency or duty cycle of the mass flow controller 171a to compensate for the varying etch rate.

Thus, in certain embodiments, a semiconductor processing apparatus is disclosed. The apparatus comprises a plasma chamber 105. The apparatus also comprises a feedgas container 170a comprising a capping species, a mass flow controller 171a, regulating the flow of capping species from the feedgas container 170a to the plasma chamber 105, a feedgas container 170b comprising a passivating species, and a mass flow controller 171b, regulating the flow of passivating species from the feedgas container 170b to the plasma chamber 105. Additionally, the apparatus comprises an RF power supply 121 that provides power to an RF antenna 120. A platen 130 is disposed within the plasma chamber 105. The platen 130 is in electrical communication with a bias power supply 135. The apparatus also comprises a controller 160 in communication with the RF power supply 121, the bias power supply 135, and the mass flow controllers 171a, 171b. The controller 160 comprises instructions that enable it to perform the functions described above and shown in FIGS. 3A-3C. Thus, the controller 160 controls the apparatus so as to create a capping period and an implant process. As described above, the controller 160 may perform the capping period before and/or during the implant process. Further, in certain embodiments, the controller 160 is in communication with a metrology system. The controller 160 may terminate the implant process based on an output of the metrology system. In other embodiments, the controller 160 may issue a warning based on the output of the metrology system.

While FIGS. 3A-3C show embodiments where the sacrificial capping layer is applied in the same plasma chamber as the implant process, in other embodiments, the sacrificial capping layer is applied outside of the plasma chamber that is used to perform the implant process. For example, in one embodiment, the workpiece may be disposed in a heated chamber, such as above 600° C., and a capping species may be introduced. Due to the presence of these species in a heated chamber, a capping layer will grow without the use of any bias voltage in this environment.

In another embodiment, the workpiece may be disposed in a pre-heat chamber having a temperature of between 200° C. and 600° C. A capping species may be introduced into the pre-heat chamber. A sacrificial capping layer may grow in these conditions. In a variation of this embodiment, a remote plasma generator is used to generate a plasma using one or more capping species. This plasma is then introduced into the pre-heat chamber.

In another embodiment, the sacrificial capping layer may be grown using a plasma deposition process (PVD). In PVD, a plasma is created using one or more capping species within a chamber that contains the workpiece. Ions or molecules from the plasma are then deposited on the workpiece to create the sacrificial capping layer.

It is also noted that there are other methods and apparatus that may be used to create the sacrificial capping layer and the disclosure is not limited to the embodiments disclosed above. Further, in certain embodiments, the chamber that is used to apply the sacrificial capping layer may also be used to heat the workpiece, such as to the temperature that is used during the passivating process.

Figure 6:
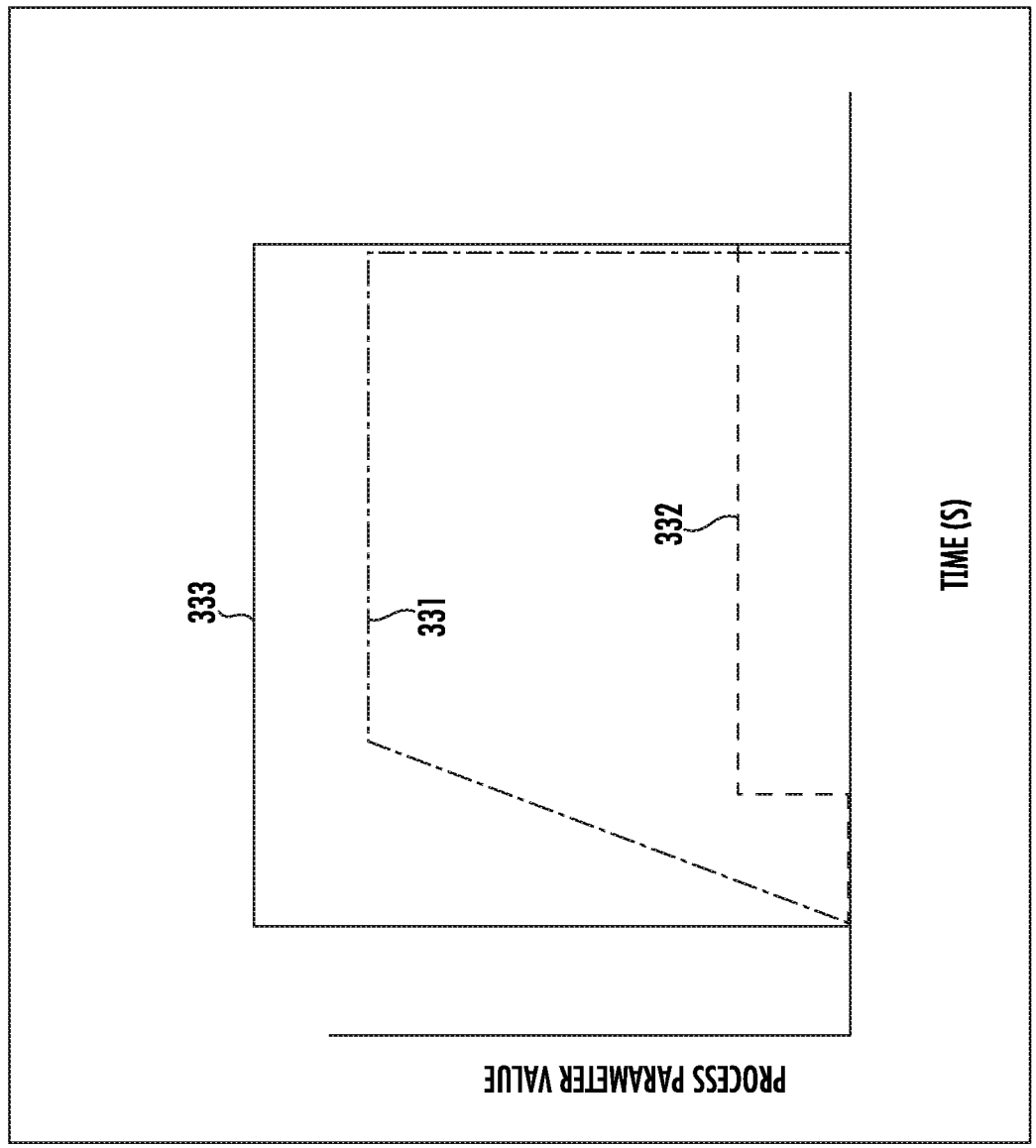
FIG. 6 shows a timing diagram for the implant process for embodiments where the sacrificial capping layer is applied outside the plasma chamber.

In each of these embodiments where the sacrificial capping layer is applied outside the plasma chamber, the flowchart shown in FIG. 4 may be used to determine the initial thickness of the sacrificial capping layer. Further, the sequence used in the plasma chamber 105 for these embodiments is shown in FIG. 6. In this figure, the vertical axis is used to represent the process parameter value. Line 331 represents the flow rate of the passivating species. Line 332 represents the bias voltage applied by the bias power supply 135 (see FIG. 1). Again, the bias voltage appears positive, however, it is understood that a negative bias voltage is used to attract positive ions. Actuation of the RF power supply 121 is shown in line 333. The flow rate of the passivating species may be different than that shown in FIG. 6. Note that FIG. 6 is similar to FIG. 3A, except the capping period is performed outside the plasma chamber 105.

Further, while the above disclosure describes an implant process that is terminated based on a predetermined time. Other embodiments are also possible. For example, in one example, such as is shown in FIG. 1, a metrology system, such as an optical emission spectroscopy (OES) system 180, may be disposed in the plasma chamber 105.

In certain embodiments, the OES system 180 may be used to terminate the implant process. Specifically, while the sacrificial capping layer 210 is being etched, the spectrum detected by the OES system 180 will show the presence of oxygen or nitrogen (depending on the composition of the sacrificial capping layer). The spectrum may also show a peak showing the presence of silicon. However, once the sacrificial capping layer 210 has been completely etched away, the spectrum will show a much larger peak for silicon and the peaks associated with oxygen and/or nitrogen will be gone. Thus, in one embodiment, rather than using a predetermined time for the implant process, the OES system 180 is used to detect when the sacrificial capping layer is gone. The implant process is then terminated upon this detection. This approach may be advantageous when the final device parameters are relatively insensitive to dose, but very sensitive to any etching of the surface.

In certain embodiments, the OES system 180 may be used as a warning system. For example, the implant process may be a timed process of a predetermined duration. However, if before the predetermined duration has expired, the OES system 180 detects an increase in the emission of silicon, the controller 160 may prematurely terminate the implant process.

In addition to OES systems, other metrology systems can be used. For example, absorption spectroscopy may be used to monitor the plasma. Alternatively, Fourier-transform infrared spectroscopy (FTIR), reflectrometry or ellipsometry may be used to monitor the sacrificial cap.

The embodiments described in this disclosure may have many advantages. For example, it is beneficial to implant ions into a semiconductor substrate to passivate that semiconductor substrate. The use of implantation allows the passivating ions to be delivered deeper into the substrate than can be done using other processes. The creation of a sacrificial capping layer allows this passivating implant to be implemented without the detrimental etching that sometimes accompanies an implant process. Thus, these embodiments expand the process space available with a given configuration, allowing greater energy and/or dose to be utilized.

While the above disclosure describes an implant that is used to passivate a workpiece, the disclosure is not limited to this embodiment. For example, the implant maybe used to alter the conductivity of the workpiece, or dope the workpiece for bulk modification. For example, the implant may be a dopant species, such as a Group 3, Group 4 or Group 5 species. Thus, in certain embodiments, the implant species may be a passivating species. In other embodiments, the implant may be a dopant species.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of passivating a portion of a workpiece, comprising:
    disposing the workpiece in a plasma chamber;
    applying a sacrificial capping layer to a top surface of the workpiece;
    creating a plasma comprising a passivating species within the plasma chamber, wherein the passivating species is selected from the group consisting of hydrogen, deuterium, fluorine and gas mixtures containing hydrogen, deuterium or fluorine as a diluent or primary processing gas and wherein ions, radicals and excited molecules of the passivating species are generated;

performing an implant process wherein the ions of the passivation species are implanted through the sacrificial capping layer and into the portion by applying a bias voltage to the workpiece, and wherein during the implant process, the radicals and excited molecules etch the sacrificial capping layer; and terminating the implant process when a desired dose of passivating species has been implanted, wherein at termination of the implant process, a thickness of the sacrificial capping layer is less than 5 angstroms or all of the sacrificial capping layer has been completely removed and less than 10 angstroms of the workpiece has been etched.

2. The method of claim 1, wherein the sacrificial capping layer is applied in the plasma chamber during a capping period by introducing a capping species, and creating a plasma comprising the capping species while the bias voltage is disabled.

3. The method of claim 2, wherein the capping period is prior to the implant process.

4. The method of claim 3, wherein additional sacrificial capping layer is applied during the implant process by flowing the capping species into the plasma chamber.

5. The method of claim 4, wherein a flow of the capping species is continuous throughout the implant process.

6. The method of claim 4, wherein a flow of the capping species is pulsed during the implant process.

7. The method of claim 6, wherein the bias voltage is varied when the capping species is flowing into the plasma chamber during the implant process.

8. The method of claim 1, wherein the implant process is terminated after a predetermined time, where the predetermined time is determined based on the passivating species and the desired dose of passivating species.

9. The method of claim 8, wherein a warning is generated if an output of a metrology system indicates that the workpiece is being etched.

10. The method of claim 1, wherein the implant process is terminated based on an output from a metrology system indicating that the workpiece is being etched.

11. The method of claim 1, wherein an initial thickness of the sacrificial capping layer is determined based on an etch rate of the sacrificial capping layer and a total duration of the implant process.

12. The method of claim 11, wherein the initial thickness is adjusted based on chamber metrology, number of workpieces processed, or hours of operation to compensate for varying etch rate.

13. The method of claim 1, wherein a thickness of the sacrificial capping layer is between 5 angstroms and 100 angstroms.

14. The method of claim 1, wherein when the bias voltage is applied, the bias voltage is a pulsed DC voltage having an amplitude between 0.1 and 10 kV.

15. A method of passivating a portion of a workpiece, comprising:
applying a sacrificial capping layer to a top surface of the workpiece in a chamber, wherein a thickness of the sacrificial capping layer is between 5 angstroms and 100 angstroms;
disposing the workpiece in a plasma chamber, wherein the plasma chamber is different from the chamber;
creating a plasma comprising a passivating species within the plasma chamber, wherein the passivating species is selected from the group consisting of hydrogen, deuterium, fluorine and gas mixtures containing hydrogen, deuterium or fluorine as a diluent or primary processing gas and wherein ions, radicals and excited molecules of the passivating species are generated;

performing an implant process wherein the ions of the passivation species are implanted through the sacrificial capping layer and into the portion by applying a bias voltage to the workpiece, and wherein during the implant process, the radicals and excited molecules etch the sacrificial capping layer; and terminating the implant process when a desired dose of passivating species has been implanted.

16. The method of claim 15, wherein the chamber:
heats the workpiece to a temperature near the temperature of the implant process; and
grows the sacrificial capping layer by flowing a gas while the workpiece is being heated.

17. A method of passivating a portion of a workpiece, comprising:
flowing a capping species into a plasma chamber, within which a workpiece is disposed;
energizing the capping species to generate a plasma, wherein, during a capping period, a bias voltage is not applied to the workpiece, so as to create a sacrificial capping layer on a top surface of the workpiece;
flowing a passivating species into the plasma chamber wherein the passivating species is selected from the group consisting of hydrogen, deuterium, fluorine and gas mixtures containing hydrogen, deuterium or fluorine as a diluent or primary processing gas;
performing an implant process, to implant passivating ions into the workpiece, wherein the implant process is defined as a period of time when a bias voltage is applied to the workpiece while a plasma comprising the passivating species is being generated;
adding material to sacrificial capping layer by flowing the capping species into the plasma chamber during the implant process; and
terminating the implant process.

18. The method of claim 17, wherein the implant process is terminated when a desired dose of passivating ions has been implanted.

19. The method of claim 17, wherein at termination of the implant process, a thickness of the sacrificial capping layer is less than 5 angstroms or all of the sacrificial capping layer has been completely removed and less than 10 angstroms of the workpiece has been etched.

20. The method of claim 17, wherein a flow of the capping species is continuous throughout the implant process.

21. The method of claim 17, wherein a flow of the capping species is pulsed during the implant process.

22. The method of claim 21, wherein the bias voltage is varied when the capping species is flowing into the plasma chamber during the implant process.

23. The method of claim 17, wherein an amount of material added is varied based on chamber metrology, number of workpieces processed, or hours of operation to compensate for varying etch rate.

24. The method of claim 23, wherein the capping species flows through a mass flow controller to the plasma chamber and the amount of material is carried by adjusting a flow rate of the capping species, a frequency at which the mass flow controller is actuated, or a duty cycle of the mass flow controller.

* * * * *